(12) United States Patent
Amer

(10) Patent No.: US 7,765,457 B2
(45) Date of Patent: *Jul. 27, 2010

(54) PARALLEL CONVOLUTIONAL ENCODER

(76) Inventor: Maher Amer, 391 Beatrice Road, Nepean, ON (CA) K2J 4Y7

( * ) Notice: Subject to any disclaimer, the term of this patent is extended or adjusted under 35 U.S.C. 154(b) by 174 days.

This patent is subject to a terminal disclaimer.

(21) Appl. No.: 11/948,953

(22) Filed: Nov. 30, 2007

(65) Prior Publication Data
US 2008/0092023 A1 Apr. 17, 2008

Related U.S. Application Data

(63) Continuation of application No. 10/629,644, filed on Jul. 29, 2003, now Pat. No. 7,318,189.

(60) Provisional application No. 60/399,728, filed on Aug. 1, 2002.

(51) Int. Cl.
H03M 13/23 (2006.01)
(52) U.S. Cl. ........................ 714/786
(58) Field of Classification Search ........... 714/786
See application file for complete search history.

(56) References Cited

U.S. PATENT DOCUMENTS

| | | | |
|---|---|---|---|
| 5,193,094 A | 3/1993 | Viterbi | |
| 5,381,425 A | 1/1995 | Bitzer et al. | |
| 5,384,809 A * | 1/1995 | Yagi et al. | 375/261 |
| 5,612,974 A | 3/1997 | Astrachan | |
| 5,787,121 A | 7/1998 | Okamoto | |
| 5,954,836 A | 9/1999 | Wang | |
| 6,081,921 A | 6/2000 | Simanapalli | |
| 6,170,077 B1 | 1/2001 | Lim et al. | |
| 6,182,265 B1 | 1/2001 | Lim et al. | |
| 6,442,729 B1 | 8/2002 | Kim et al. | |
| 6,523,146 B1 | 2/2003 | Ishikawa | |
| 6,598,203 B1 * | 7/2003 | Tang | 714/790 |
| 6,631,488 B1 | 10/2003 | Stambaugh et al. | |
| 6,697,994 B2 | 2/2004 | Ishikawa | |
| 6,745,365 B2 | 6/2004 | Kokuryo et al. | |
| 6,751,773 B2 | 6/2004 | Okabayashi et al. | |
| 6,954,885 B2 | 10/2005 | Hurt et al. | |
| 7,287,210 B2 * | 10/2007 | MacDougall | 714/786 |

FOREIGN PATENT DOCUMENTS

EP 1176727 A2 1/2002

OTHER PUBLICATIONS

Clark and Cain, "Error-Correction Coding for Digital Communications", 1981, Plenum Press, NY, pp. 252-253.*

(Continued)

*Primary Examiner*—Stephen M Baker
(74) *Attorney, Agent, or Firm*—Stolowitz Ford Cowger LLP

(57) ABSTRACT

Methods and devices for encoding in parallel a set of data bits for use in communications systems. The set of data bits to be encoded is divided into two subsets with the first subset being encoded in parallel using the second subset. The first subset is also encoded in parallel using the second subset. The first subset is also encoded in parallel using a subset of an immediately preceding set of data bits. Parallel encoding is realized by using an encoding module utilizing multiple single bit submodule. Each submodule receives a single bit from the first subset and either the second subset or the subset of the immediately preceding data set. Each single bit submodule produces a pair of output bits from the convolutional encoding of a single bit of the first subset and either the second subset or the subset of the immediately preceding data set. The multiple single bit submodules operate in parallel to simultaneously and collectively produce a set of data bits.

16 Claims, 3 Drawing Sheets

OTHER PUBLICATIONS

M'Sir et al., A High Speed Encoder for Recursive Systematic Convolutive Codes, Proceedings of the Eight IEEE International On-line Testing Workshop, Jul. 2002, pp. 51-55.

T.K. Matsushima et al., Parallel Encoder and Decoder Architecture for Cyclic codes, IEICE Trans. Fundamentals. vol. E79-A No. 9, Sep. 1996, pp. 1313-1323.

D. Haccoun et al., New Architectures for Fast Convolutional Encoders and Threshold Decoders, IEEE Journal on Selected Areas in Communications, vol. 6, No. 3, Apr. 1998, pp. 547-557.

PCT International Search Report for International Application No. PCT/CA03/01133.

* cited by examiner

PARALLEL CONVOLUTIONAL ENCODER

RELATED APPLICATIONS

The present application is a continuation of U.S. pending application Ser. No. 10/629,644, filed Jul. 29, 2003, which claims priority to U.S. provisional application Ser. No. 60/399,728 filed Aug. 1, 2002.

FIELD OF THE INVENTION

The present invention relates to the field of wireless communications and is particularly, but not exclusively, applicable to methods and apparatus for encoding sets of information bits for use in a wireless communications system.

BACKGROUND

The recent revolution in telecommunications has led to developments in all technologies relating to communications. One area which has seen a significant amount of growth in not only the adoption and use of, but also in its development, is wireless technology. Unfortunately, one area of wireless technology which not been fully developed or examined is the speed at which data is encoded in wireless devices prior to its wireless transmission to a wireless receiver. This encoding is necessary to allow for forward error correction (FEC) techniques to be applied at the receiver. Such FEC technologies allow for the correction of errors which may be introduced into the data when it is wirelessly transmitted.

One such encoding can be convolutional encoding. The encoded data (with the encoding producing more data than was input to allow for the inclusion of the error correction redundancies in the data), when received by the receiver, is decoded by a decoder. Such decoders normally use the well known Viterbi decoding method in one form or another to retrieve the original data. However, while transmission speeds and decoding speeds have been pushed higher and higher, the encoding is still executed in a serially bitwise manner. Essentially, data to be encoded is serially fed to the encoder and the resulting encoded data is also output serially. This approach is seen in U.S. Pat. No. 5,193,094 issued to Viterbi, U.S. Pat. No. 5,787,121 issued to Okamoto, and US Patent Application Publication 2001008022 A1 (Kokuryo et al). It should be note that Okamoto uses multiple serial encoders arranged in a parallel manner to try and attempt a pseudo-parallel implementation of convolutional encoders.

While at least one of the above-mentioned disclosures tries to overcome the problem of serial convolutional encoding, none of them actually succeed. One problem with using serial convolutional encoders is that to increase the encoding speed, the speed of the clocking signal used by the encoder is increased. Unfortunately, such an approach would not only lead to increased power consumption but also to elevated device temperatures and more complex circuit layouts when implementing the design.

An ideal solution to the above issue would be a parallel implementation of a convolutional encoder. Such an encoder would encode data in a bitwise parallel manner.

It is an object of the present invention to present alternatives to the prior art and to at least mitigate the drawbacks of the prior art.

SUMMARY

The present invention relates to methods and devices for encoding in parallel a set of data bits for use in communications systems. The set of data bits to be encoded is divided into two subsets with the first subset being encoded in parallel using the second subset. The first subset is also encoded in parallel using a subset of an immediately preceding set of data bits. Parallel encoding is realized by using an encoding module utilizing multiple single bit submodules. Each submodule receives a single bit from the first subset and either the second subset or the subset of the immediately preceding data set. Each single bit submodule produces a pair of output bits from the convolutional encoding of a single bit of the first subset using either the second subset or the subset of the immediately preceding data set. The multiple single bit submodules operate in parallel to simultaneously and collectively produce a set of output data bits.

In a first aspect, the present invention provides a method for encoding a plurality of data bits for use in communications device, the method comprising:
  a) receiving a set of data bits for encoding;
  b) encoding in parallel a subset of said set of data bits using at least one other subset of data bits to produce at least one first set of output bits;
  c) encoding in parallel said subset of said set of data bits using at least one previous subset of data bits to produce at least one second set of output bits, said previous subset being a subset of a previous set of data bits.

In a second aspect, the present invention provides a method for encoding a set of data bits for use in a communications system, the method comprising the steps of:
  a) receiving first and second subsets of said set of data bits;
  b) convolutionally encoding said first subset using said second subset to produce a first set of output bits;
  c) convolutionally encoding said first subset using a previous subset of an immediately preceding set of data bits to produce a second set of output bits; and
  d) replacing said previous subset with said second subset of said set of data bits for use with a next set of data bits, wherein said encodings in steps b) and c) are executed in a bitwise parallel manner.

In a third aspect, the present invention provides a device for encoding a set of data bits for use in a communications system, the device comprising:
  first receiving means for receiving and storing a first subset of said set of data bits;
  second receiving means for receiving and storing a second subset of said set of data bits;
  storage means for storing a subset of an immediately preceding set of data bits; first encoding means for convolutionally encoding a subset of data bits, said first encoding means receiving inputs from said first receiving means and from said second receiving means to produce a first set of output bits;
  second encoding means for convolutionally encoding a subset of data bits, said second encoding means receiving inputs from said first receiving means and from said storage means to produce a second set of output bits;
  switching means for storing contents of said second receiving means in said storage means,
  wherein said storage means and said switching means are activated after said first and second sets of output bits have been produced.

In a fourth aspect, the present invention provides a system for encoding a current set of data bits for use in a communications device, the device comprising:

at least two encoding stages for encoding a subset of said current set of data bits, each of said at least two stages comprising:

first receiving means for receiving and storing a first subset of said current set of data bits;

storage means for storing a subset of data bits, said subset of data bits being chosen from a group comprising:
a second subset of said current set of data bits; and
a subset of a previously received set of data bits.

encoding means for encoding contents of said first receiving means using contents of said storage means to produce a set of output bits, wherein at least one encoding stage receives a subset of data bits from another encoding stage for storage in said storage means and for encoding a subset of said current set of data bits.

DESCRIPTION OF THE DRAWINGS

A better understanding of the invention will be obtained by considering the detailed description below, with reference to the following drawings in which.

DETAILED DESCRIPTION

Figure 1:
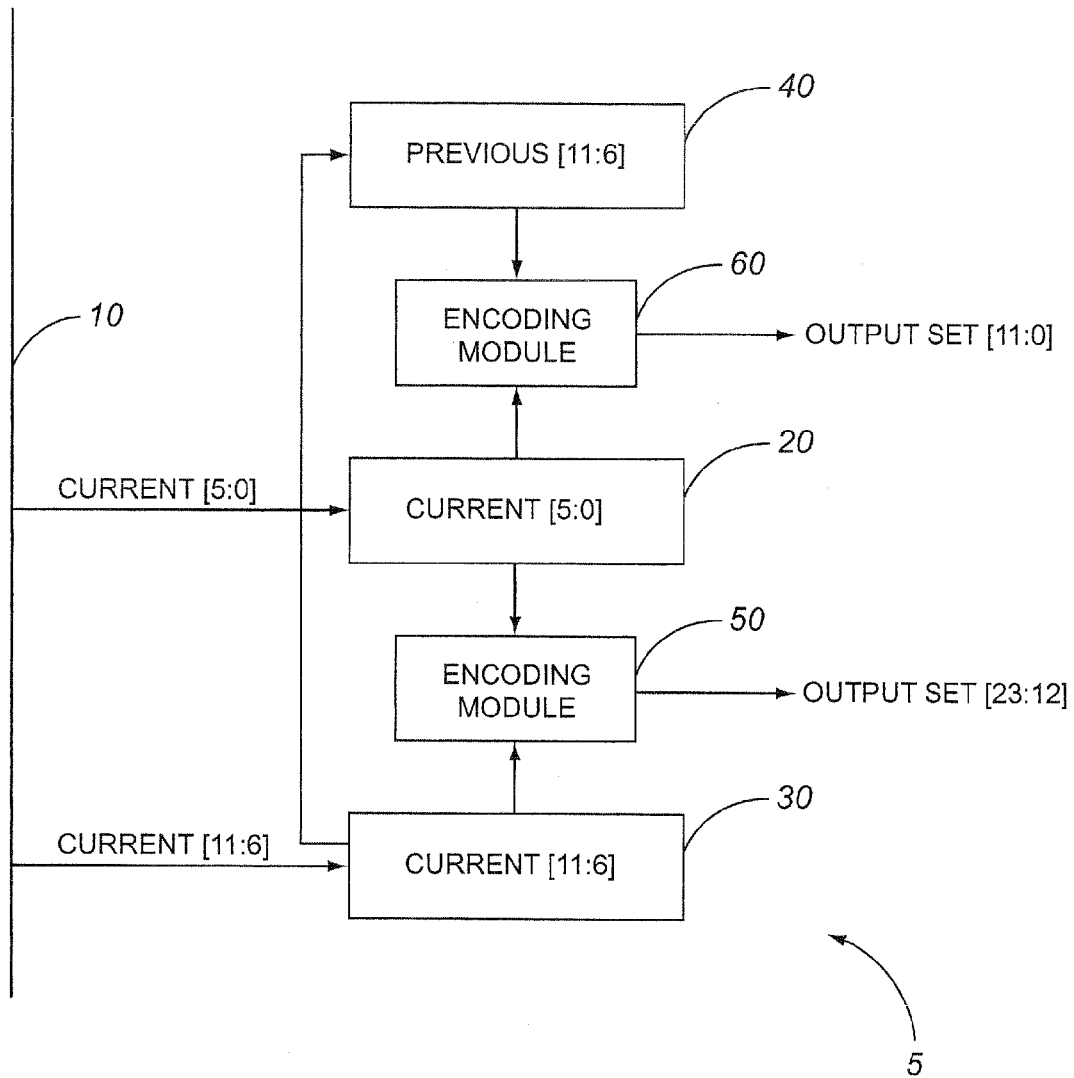
FIG. 1 is a block diagram of an encoder system according to one embodiment of the invention.

Referring to FIG. 1, a block diagram of a parallel encoder system 5 is illustrated. A bus 10 feeds a first receiving means 20 and a second receiving means 30 while a storage means 40 is coupled to the second receiving means 30. A first encoding module 50 (also referred to as first encoding means) is coupled to the first receiving means 20 and the second receiving means 30. A second encoding means 60 (also referred to as second encoding means 60) is coupled to the storage means 40 and the first receiving means 20.

In operation, the encoder system 5 receives in parallel a current set of data bits to be encoded by way of the bus 10. The current set of data bits (CURRENT [11:0]) is separated into two subsets with a first subset being fed into the first receiving means 20 and a second subset begin fed into the second receiving means 30. The storage means 40 stores a subset (PREVIOUS [11:6]) of an immediately preceding set of data bits. Once the current set of data bits are stored in the first and second receiving means, these are sent to the encoding modules 50, 60 with the first encoding module 50 receiving the first and second subsets of the current set of data bits. The second encoding module 60 receives the first subset and the subset stored in the storage means 40. The encoding modules 50, 60 then encode, in a parallel bitwise manner, the first subset using the second subset and the subset stored in the storage means 40. Each encoding module independently produces a set of output bits which, when taken together, comprise the output of the encoder system 5. The encoder system output can then be fed into another bus (not shown) for transportation to a next stage in processing.

It should be noted that, for this embodiment of the invention, convolutional encoding is performed by the encoding modules 50, 60. Furthermore, for this embodiment the bus 10 is a 12 bit bus carrying a current set of 12 bits with each subset having 6 data bits. The 6 LSB (least significant bits CURRENT [5:0]) of the 12 bit current set is fed and stored by the first receiving means 20 while the 6 MSB (most significant bits CURRENT [11:6]) of the 12 bit current set is fed and stored by the second receiving means 30. The storage means 40 receives the second subset (PREVIOUS [11:6]) stored in the second receiving means 30 when a new current set of data bits is clocked into the second receiving means. A switching means for storing the contents of the second receiving means 30 can be also feed into the storage means 40. Alternatively, the switching/storing can be done as soon as the set of output data bits are produced. To initiate the encoder system, all zeros are set as the content of the storage means 40.

It should further be noted that for convolutional encoding, and for the embodiment illustrated, each of the encoding modules produce a 12 bit output set. Furthermore, the storage means 40 and the first and second receiving means 20, 30 can be constructed as registers or suitable flip-flop circuits. Data subsets can then be clocked into the registers or flip-flops in parallel and can also be fed in parallel into the encoding modules 50, 60.

For the encoding modules 50, 60, in the embodiment illustrated, each encoding module has 12 data inputs—a 6 bit subset of the current set of data bits and a 6 bit subset from either the current set or the immediately preceding set of data bits. As previously mentioned, an output set of 12 data bits result from each of the encoding modules.

Figure 2:
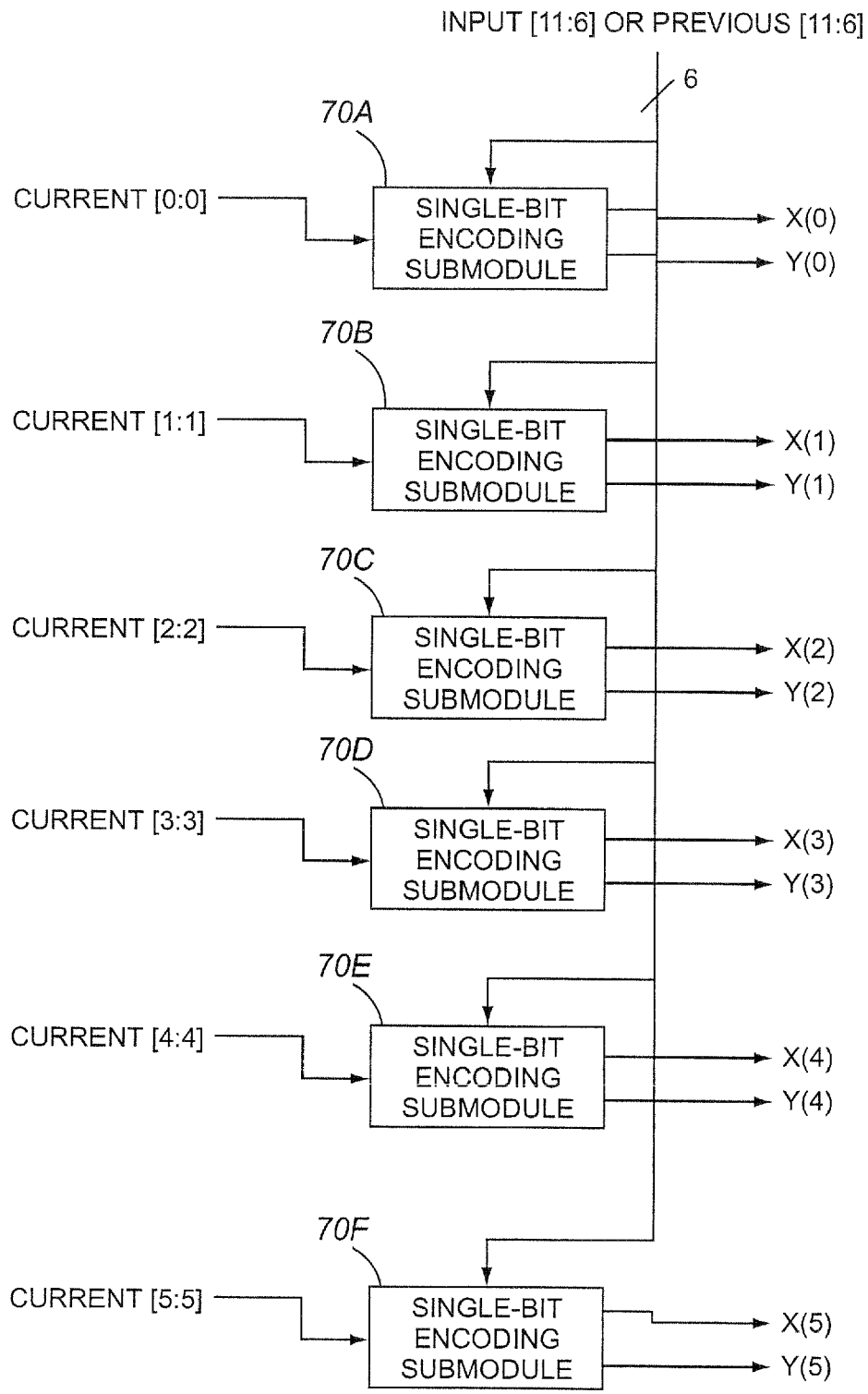
FIG. 2 is a block diagram of an encoding of an encoding module used in the encoder system of FIG. 1.

Each encoding module may be implemented as illustrated in FIG. 2. As can be seen in FIG. 2, a number of single-bit encoding submodules 70A-70F are present with each submodule receiving 7 data inputs—a single bit from the first subset (one of CURRENT [5:0]) and 6 bits from either the second subset (CURRENT 11:6]) or the subset stored in the storage means (PREVIOUS [11:6]). The single bit to be encoded is encoded using the other 6 bit input to result in two output bits. These output bits (x[0], y[0] to x[5], y[5]) comprise the output set of bits for the encoding module. Each submodule implements a combinational logic circuit that accomplishes the encoding. In one embodiment, the logic to be implemented for encoding IEEE 802.11a or Hiperlan 2 bitstreams is similar. The x and y equations for these two standards are as follows:

$$x[n] = \{XOR(in, s[4], s[3], s[1], s[0])\}$$

$$y[n] = \{XOR(in, s[5], s[4], s[3], s[0])\}$$

with in=nth input bit from current set;
s[a]=the ath bit from the 6 bit input to the single bit encoding submodule.

Figure 3:
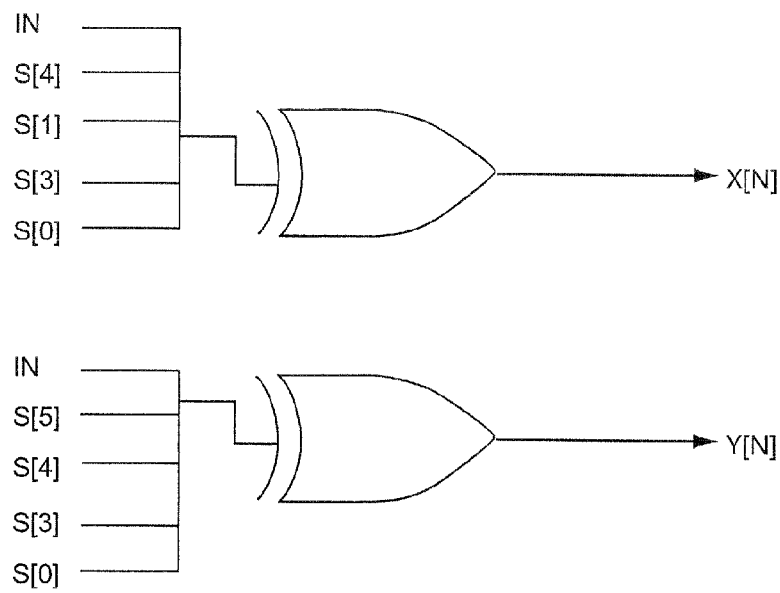
FIG. 3 is logic diagram illustrating the logic implemented by a single-bit encoding submodule used in the encoding module of FIG. 2.
Figure 4:
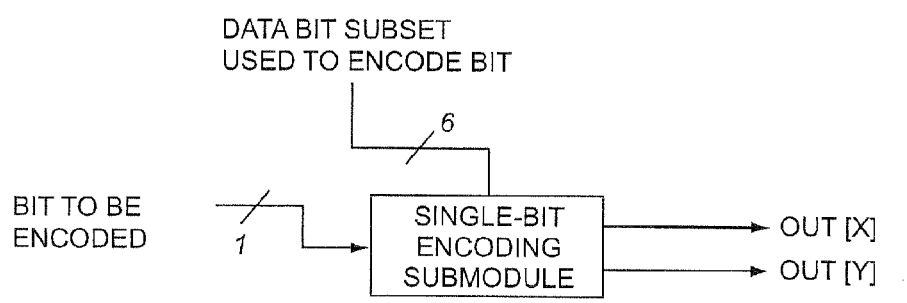
FIG. 4 is a block diagram of a single-bit encoding submodule used in the encoding module of FIG. 2.

The logic can therefore be simplified into the diagrams in FIG. 3. The XOR gates in FIG. 3 each have 5 inputs and specifically implement the logical equations presented above. However, other combinational circuits and other encoding schemes may be implemented by the single bit encoding submodules. To illustrate, FIG. 4 shows a single bit encoding submodule with 7 inputs and 2 outputs. The submodule can then implement any encoding scheme as long as the combinational circuit within is properly configured.

The above concepts and designs can therefore encode, in a parallel bitwise manner, a set of current data bits. To extend its capabilities, the system 5 in FIG. 5 can be seen as a two stage encoding system with each stage having three components—a first receiving means (such as receiving means 20), a storage means (such as receiving means 30 or storage means 40), and an encoding module which encodes the data in the first receiving means using the data in the storage means.

Multiple stages can therefore be either cascaded or placed in parallel to encode multiple bit sets of data bits. Furthermore, the cascading need not be merely in terms of the output bits being cascaded in successive stages. The inputs may also be cascaded such as in the embodiment explained above where a current input subset (such as CURRENT [11:6]) is subsequently used by a later stage in a succeeding step (such as becoming the subset PREVIOUS [11:6]).

While the above embodiment convolutionally encodes a set of data bits, other encoding schemes may be used by changing or amending the internal combinational logic circuit used by the single-bit encoding submodule or by rearranging the sequence and/or position of the encoding stages as explained above. It should also be noted that other bit widths other than a 12 bit set or a 6 bit subset may be used. Furthermore, the design may be extended to other encoding schemes so that not all of the resulting or output bits of the encoder system 5 may be valid or useful. For the convolutional system explained above, different coding rates produce different numbers of valid or useful bits. As an example, for a coding rate of ½, all 24 outputs bits from the encoder system 5 are valid. However, for a coding rate of ⅔ only the 18 LSB bits are valid. For this encoding rate, only 6 bits of the output set produced by the encoding module 50 are valid. For a coding rate of ¾, only the 16 LSB bits of the overall set output are valid. Thus, only 4 bits of the output set produced by the encoding module 50 are valid.

A person understanding this invention may now conceive of alternative structures and embodiments or variations of the above all of which are intended to fall within the scope of the invention as defined in the claims that follow.

I claim:

1. A method comprising:
   dividing a current data set into first and second subsets;
   parallel encoding the second subset using the first subset; and
   parallel encoding the first subset using an un-encoded subset of a past data set immediately preceding the current data set.

2. The method of claim 1
   where parallel encoding the second subset includes convolutionally encoding the second subset in a parallel bitwise manner; and
   where parallel encoding the first subset includes convolutionally encoding the first subset in a parallel bitwise manner.

3. The method of claim 1 where parallel encoding the first and second subsets occurs substantially simultaneously.

4. The method of claim 1 where parallel encoding the first subset includes:
   receiving at least a single bit of the first subset;
   receiving the un-encoded subset of a past data set immediately preceding the current data set; and
   producing two output bits by convolutionally encoding at least the single bit of the first subset with the un-encoded subset of the past data set.

5. The method of claim 1
   where parallel encoding the first subset includes XORing at least a single bit of the first subset with a predetermined bits of the un-encoded subset of the past data set.

6. An encoding means comprising:
   means for dividing a current data set into first and second subsets;
   means for parallel encoding the second subset using the first subset; and
   means for parallel encoding the first subset using an un-encoded subset of a previous data set immediately preceding the current data set.

7. The encoding means of claim 6
   where the means for parallel encoding the second subset includes means for convolutionally encoding the second subset in a parallel bitwise manner; and
   where the means for parallel encoding the first subset includes means for convolutionally encoding the first subset in a parallel bitwise manner.

8. The encoding means of claim 6
   where the means for parallel encoding the first subset and the means for parallel encoding the second subset operate substantially simultaneously.

9. The encoding means of claim 6 where the means for parallel encoding the first subset includes means for producing at least two output bits by convolutionally encoding at least a single bit of the first subset with at least a single bit of the un-encoded subset of the past data set.

10. The encoding means of claim 6 where the means for parallel encoding the first subset includes means for XORing at least a single bit of the first subset with predetermined bits of the un-encoded subset of the past data set.

11. An encoder comprising:
    a memory to store a current data set and a previous data set where the previous data set precedes the current data set; and
    a plurality of encoding sub-modules to encode corresponding single bits of a first subset of the current data set with single bits of a subset of the previous data set and to encode corresponding single bits of a second subset of the current data set with corresponding single bits of the first subset of the current data set.

12. The encoder of claim 11 where each of the plurality of encoding sub-modules operates substantially simultaneously with others of the plurality of encoding sub-modules.

13. The encoder of claim 11 where each of the plurality of encoding sub-modules is configured to encode at least one of the single bits of the first subset with at least one of the single bits of the subset of the previous data set.

14. The encoder of claim 13 where each of the plurality of encoding sub-modules is configured to encode at least one of the single bits of the second subset of the current data set with at least one of the single bits of the first subset of the current data set.

15. The encoder of claim 11 where each of the plurality of encoding sub-modules includes an XOR logic circuit configured to XOR at least one of the single bits of the first subset of the current data set with at least one of the single bits of the subset of the previous data set.

16. The encoder of claim 15 where each of the plurality of encoding sub-modules includes an XOR logic circuit configured to XOR at least the single bit of the second subset of the current data set with at least one of the single bits of the first subset of the current data set.

* * * * *